(12) United States Patent
Bechtel et al.

(10) Patent No.: US 10,957,824 B2
(45) Date of Patent: Mar. 23, 2021

(54) HIGH LUMINANCE CRISP WHITE LED LIGHT SOURCE

(71) Applicant: Lumileds LLC, San Jose, CA (US)

(72) Inventors: Hans-Helmut Bechtel, Roetgen (DE); Erik Roeling, Eindhoven (NL)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 16/096,598

(22) PCT Filed: Apr. 21, 2017

(86) PCT No.: PCT/EP2017/059499
§ 371 (c)(1),
(2) Date: Oct. 25, 2018

(87) PCT Pub. No.: WO2017/186589
PCT Pub. Date: Nov. 2, 2017

(65) Prior Publication Data
US 2019/0140146 A1   May 9, 2019

(30) Foreign Application Priority Data
Apr. 29, 2016   (EP) ..................... 16167647

(51) Int. Cl.
| H01L 33/50 | (2010.01) |
| H01L 25/075 | (2006.01) |
| H01L 27/15 | (2006.01) |
| H01L 33/58 | (2010.01) |
| H01L 33/60 | (2010.01) |
| F21K 9/64 | (2016.01) |
| F21Y 115/30 | (2016.01) |
| F21Y 115/10 | (2016.01) |

(52) U.S. Cl.
CPC ........ *H01L 33/502* (2013.01); *H01L 25/0753* (2013.01); *H01L 25/0756* (2013.01); *H01L 27/15* (2013.01); *H01L 33/58* (2013.01); *H01L 33/60* (2013.01); *F21K 9/64* (2016.08); *F21Y 2115/10* (2016.08); *F21Y 2115/30* (2016.08)

(58) Field of Classification Search
CPC combination set(s) only.
See application file for complete search history.

(56) References Cited

U.S. PATENT DOCUMENTS

| 6,682,207 | B2 | 1/2004 | Weber et al. | |
| 2003/0186165 | A1 | 10/2003 | Gries et al. | |
| 2009/0134409 | A1* | 5/2009 | Wang | H01L 25/0756 257/89 |
| 2010/0128461 | A1* | 5/2010 | Kim | H01L 25/0753 362/84 |

(Continued)

FOREIGN PATENT DOCUMENTS

EP   2650918 A1   10/2013

OTHER PUBLICATIONS

European Search Report corresponding to EP 16167647, dated Oct. 17, 2016, 6 pages.

(Continued)

*Primary Examiner* — Nduka E Ojeh

(57) ABSTRACT

A light-emitting diode or device (LED) package includes a substrate, a white LED above the substrate, and a violet LED or laser above a wavelength converter of the white LED or laterally offset from the wavelength converter.

12 Claims, 4 Drawing Sheets

(56) References Cited

U.S. PATENT DOCUMENTS

| | | | | |
|---|---|---|---|---|
| 2010/0259918 A1* | 10/2010 | Rains, Jr. | ............... | F21V 7/0025 |
| | | | | 362/84 |
| 2011/0044046 A1* | 2/2011 | Abu-Ageel | ............... | F21K 9/00 |
| | | | | 362/259 |
| 2014/0301062 A1* | 10/2014 | David | ................... | F21V 9/30 |
| | | | | 362/84 |
| 2015/0049459 A1* | 2/2015 | Peeters | ............... | H01L 25/0753 |
| | | | | 362/84 |
| 2016/0076735 A1* | 3/2016 | Wang | ................. | G01N 21/6456 |
| | | | | 362/84 |
| 2018/0206411 A1* | 7/2018 | Chen | ................... | F21V 29/70 |
| 2018/0254263 A1* | 9/2018 | Hamada | ................... | G02B 5/02 |

OTHER PUBLICATIONS

From the EPO acting as the ISA, International Search Report corresponding to PCT/EP2017/059499, dated Jul. 21, 2017, 4 pages.

Witten Opinion from the EPO as the ISA, Written Opinion of the International Searching Authority corresponding to PCT/EP2017/059499, dated Jul. 21, 2017, 7 pages.

\* cited by examiner

HIGH LUMINANCE CRISP WHITE LED LIGHT SOURCE

FIELD OF THE INVENTION

The present disclosure relates to semiconductor light-emitting diodes or device (LEDs), and more particular to LED lamps.

BACKGROUND

When illuminated by daylight, untreated white items, such as fabrics made from natural fibers, tend to appear yellow or ivory to the naked eye. These fibers absorb the blue content of incident white light, resulting in a reflected light that appears yellowish.

Designers incorporate Fluorescent Whitening Agents (FWAs) into dyes, inks and even laundry detergent to brighten fabrics. These agents absorb photons with wavelengths in the near ultraviolet, violet, and deep blue spectrum, which are difficult for the human eye to see. The energy of the absorbed photons is re-emitted by the fabric in the form of photons with longer wavelengths, typically in the blue spectrum. By incorporating FWAs into fabrics, designers can compensate for the natural deficiency of the blue spectral content in reflected light from white fabrics.

Traditional white light-emitting diodes or devices (LEDs) produce white light from blue emitting LEDs covered with a yellow emitting phosphor. Such white LEDs do not have sufficient spectral content in the near ultraviolet, violet, and deep blue spectrum to activate the FWAs in white objects.

US 2015/0049459 discloses a light emitting module with a first light emitting element having an emission peak in the wavelength range of 400-440 nm and a second light emitting elements having an emission peak in the wavelength range from 440-460 nm. The first and the second light emitting element are located below a wavelength converting element. The wavelength converting element is arranged to receive light from the first light emitting element and being capable of emitting light having an emission peak in the green to red wavelength range. The module provides white light with a "crisp white" effect.

SUMMARY

One or more examples of the present disclosure, a light-emitting diode or device (LED) package includes a substrate, a white LED above the substrate, and a violet LED above a wavelength converter of the white LED or laterally offset above the wavelength converter.

BRIEF DESCRIPTION OF THE DRAWINGS

In the drawings.

Use of the same reference numbers in different figures indicates similar or identical elements.

DETAILED DESCRIPTION

Figure 1:
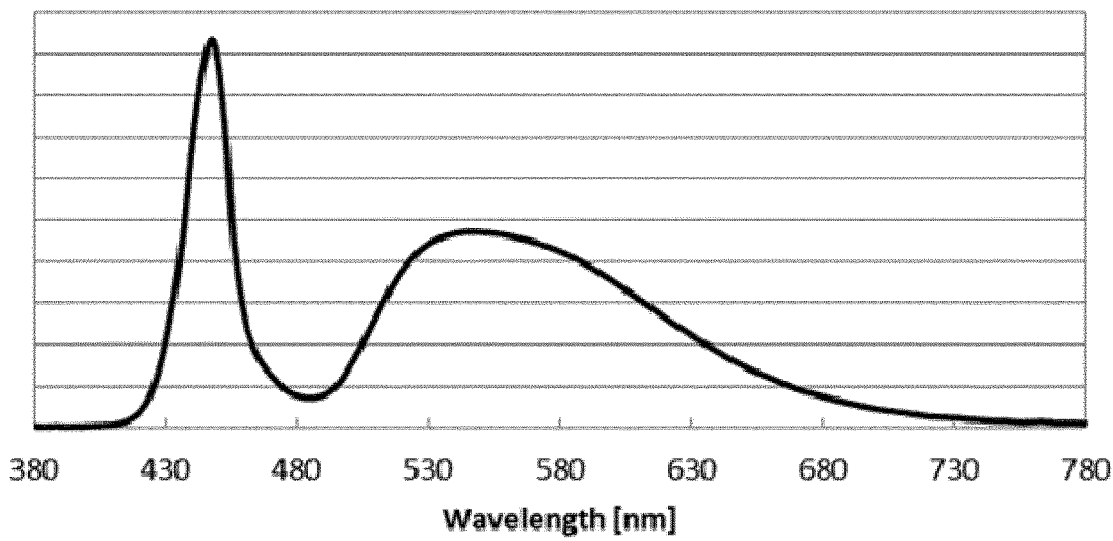
FIG. 1 shows the emission spectrum of a white light-emitting diode or device (LED) package.

FIG. 1 shows the emission spectrum of a white light-emitting diode or device (LED) package. As can be seen, the spectral content below 430 nanometer (nm) is very low. A measure for the spectral content in this wavelength range called "whiteness W" is calculated according to the following equation.

$$W = \frac{\int_{380}^{430} I(\lambda)(430 - \lambda)d\lambda}{\int_{380}^{780} I(\lambda)d\lambda}$$

Table 1 provides the performance data for the emission spectrum shown in FIG. 1.

TABLE 1

| CCT | Flux (lm) | CRI | R9 | LE | u' | v' | x | y | Whiteness |
|---|---|---|---|---|---|---|---|---|---|
| 5887.1 | 680.6 | 68.5 | −35.2 | 330.4 | 0.200 | 0.478 | 0.324 | 0.344 | 0.13 |

LUXEON Chip on Board (CoB) with CrispWhite Technology from Lumileds of San Jose, Calif., is designed to provide more light in the deep blue spectrum to activate the fluorescent whitening agents found in nearly all clothing, fabrics, and paints. Like traditional white LEDs, LUXEON CoB with CrispWhite Technology relies on blue LEDs with a typical peak wavelength of 455 nm and coats them with phosphors to emit yellow-green and red wavelengths. The combination of the blue, yellow-green, and red light creates the desired white light.

To excite the FWAs, LUXEON CoB with CrispWhite Technology includes some die that emits violet light with a lower peak wavelength less than 430 nm, and covering both the blue and the violet LEDs with the phosphors. The second peak is deep blue, between 400 nm and 415 nm. This wavelength is short enough to stimulate the FWAs as well as far enough towards the edge of the eye's wavelength sensitivity curve that it has little effect on the perceived light with items that have not been treated with FWAs.

Figure 2:
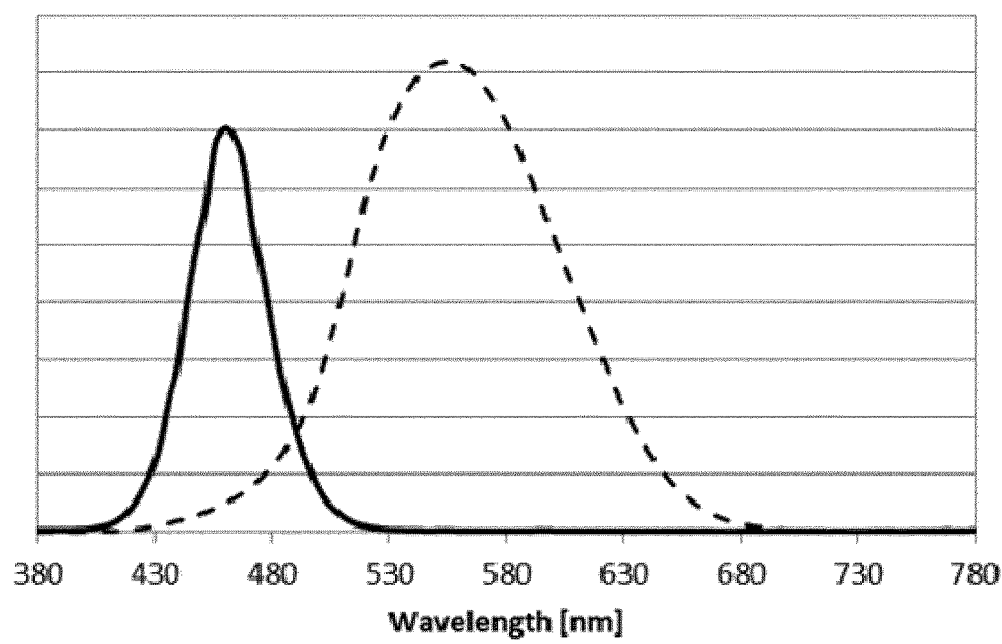
FIG. 2 shows the absorption spectrum for yttrium aluminum garnet (YAG) phosphors and the human eye sensitivity curve.

A LED package that places both the blue and the violet LEDs below the phosphors has the disadvantage that its white flux is reduced because flux and luminance are limited by the size of the blue LED, which usually takes up the entire emitting area. The violet LED does not contribute because the phosphors hardly absorb light with wavelengths less than 430 nm and the human eye sensitivity is low for light with wavelengths less than 430 nm. FIG. 2 shows the absorption spectrum for yttrium aluminum garnet (YAG) phosphors and the human eye sensitivity curve.

Figure 3:
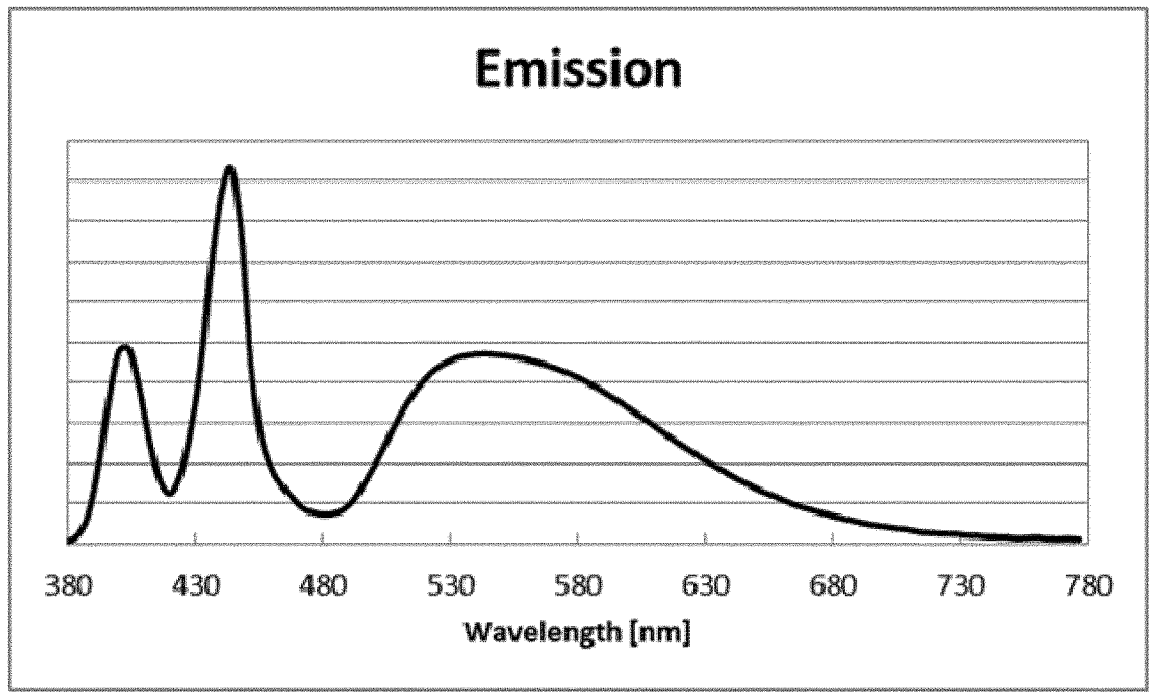
FIG. 3 shows emission spectrum of such a LED package with a violet LED in examples of the present disclosure.

In examples of the present disclosure, a LED package includes a blue LED, a wavelength converter above the blue LED, and a violet LED that is above or laterally displaced from the wavelength converter. FIG. 3 shows emission spectrum of such a LED package with a violet LED having peak emission, e.g., at 405 nm in examples of the present disclosure.

Table 2 provides the performance data for the emission spectrum shown in FIG. 3.

TABLE 2

| CCT | Flux (lm) | CRI | R9 | LE | u' | v' | x | y | Whiteness |
|---|---|---|---|---|---|---|---|---|---|
| 6055.7 | 680.8 | 68.7 | −31.4 | 296.4 | 0.200 | 0.474 | 0.321 | 0.337 | 2.49 |

Comparing the data for both emission spectra in Tables 1 and 2 shows that the color point is shifted very little, the whiteness W increased from 0.13 to 2.49, and the emitted flux stays substantially constant.

Figure 4:
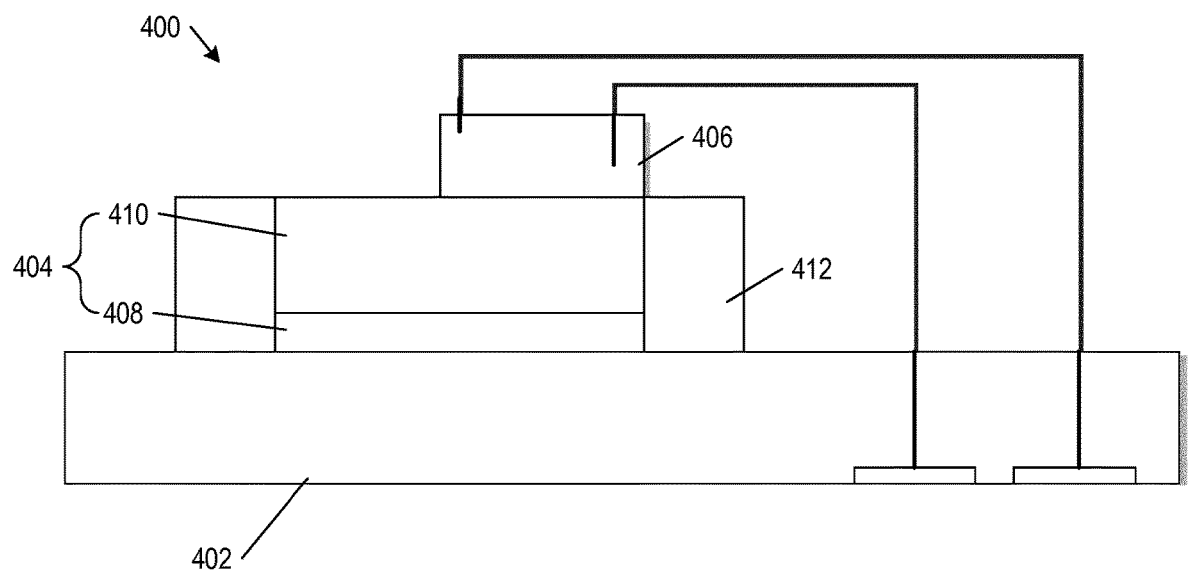
FIGS. 4, 5, 6, 7, and 8 illustrate LED packages in examples of the present disclosure.

FIG. 4 illustrates a LED package 400 in examples of the present disclosure. Package 400 includes a substrate 402, a white emitting LED 404 above substrate 402, and a violet emitting LED 406 above white LED 404. As used herein, "above" includes an element being mounted directly on another element.

Substrate 402 may be a submount or a circuit board.

White emitting LED 404 has a peak wavelength greater than 430 nm, such as between 430 and 480 nm (e.g., 455 nm). White emitting LED 404 includes a blue emitting LED die 408 and a wavelength converter 410 above blue LED die 408. Blue emitting LED die 408 may be a vertical or a thin-film flip-chip (TFFC) die that is formed on a pattern sapphire substrate (PSS).

Violet emitting LED 406 is located above wavelength converter 410. Violet emitting LED 406 emits violet light onto wavelength converter 410, which scatters and emits the violet light with the white light. In some cases, wavelength converter 410 may include phosphors (e.g., red phosphors) that absorb part of the violet light and emit a red light. Violet emitting LED 406 has a peak wavelength less than 430 nm, such as between 400 nm and 415 nm (e.g., 405 nm). Violet emitting LED 406 is transparent to light emitted by white emitting LED 404. Violet LED 406 may be a lateral die having electrical contacts on a top side of the die, which may be electrically connected (e.g., by bonding wires) to contacts in substrate 402.

Wavelength converter 410 includes yellow-green phosphors, red phosphors, or a combination of yellow-green and red phosphors. Wavelength converter 410 may be a YAG ceramic phosphor plate, such as Lumiramic from Lumileds of San Jose, Calif.

To increase luminance, package 400 may include a reflective side coating 412 on lateral surfaces of white emitting LED 404 (i.e., on lateral surfaces of blue emitting LED die 408 and wavelength converter 410).

Figure 5:
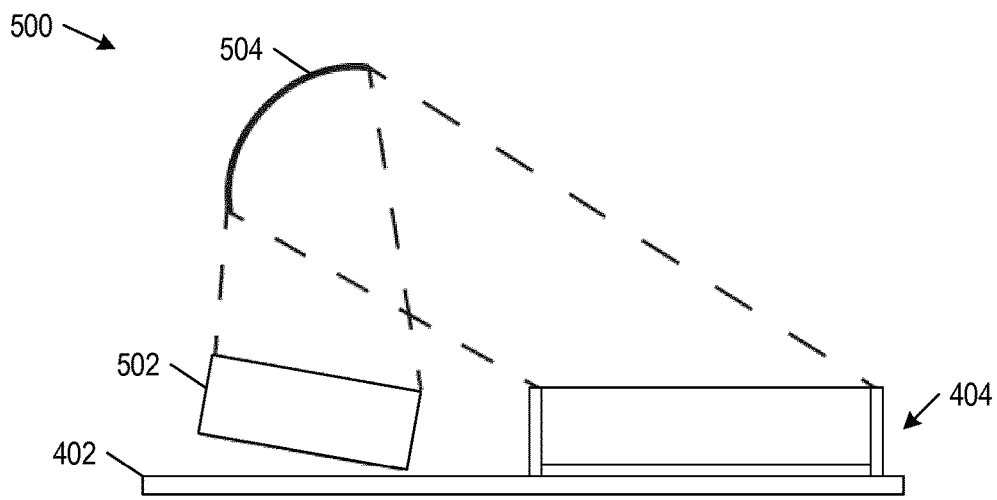

FIG. 5 illustrates a LED package 500 in examples of the present disclosure. Package 500 includes substrate 402, white emitting LED 404 above substrate 402, and a violet emitting LED 502, and an optic 504.

Violet emitting LED 502 is laterally offset from wavelength converter 410 of white emitting LED 404. Violet LED 502 is transparent to light emitted by white emitting LED 404. Violet LED 502 may be a lateral die having electrical contacts on a top side of the die.

Optic 504 images violet light from violet LED 502 onto wavelength converter 410. Optic 504 may be an imaging mirror.

Wavelength converter 410 includes yellow-green phosphors, red phosphors, or a combination of yellow-green and red phosphors. Wavelength converter 410 may be YAG phosphors mixed into a silicone matrix material.

Package 500 may include reflective side coating 412 on lateral surfaces of white emitting LED 404 (i.e., on lateral surfaces of blue emitting LED die 408 and wavelength converter 410).

Figure 6:
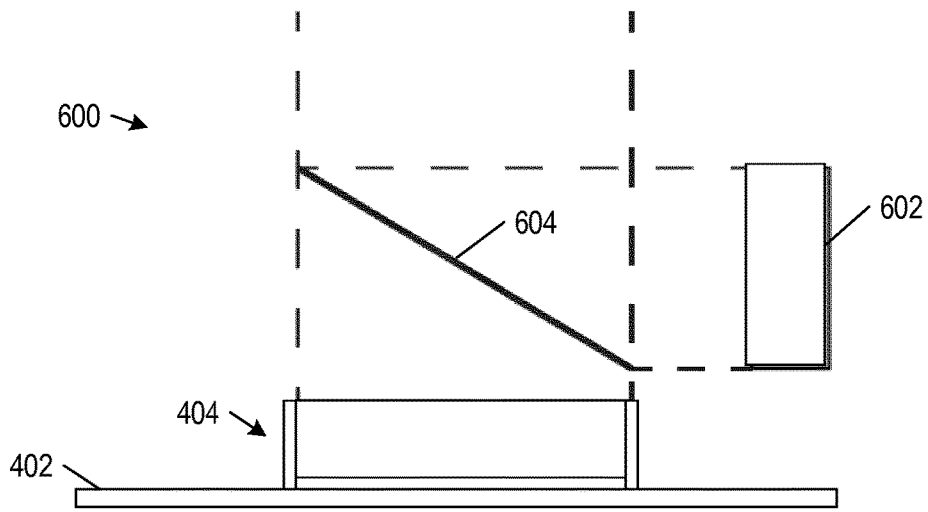

FIG. 6 illustrates a LED package 600 in examples of the present disclosure. Package 600 includes substrate 402, white emitting LED 404 above substrate 402, a violet emitting LED 602, and a dichroic combiner 604.

Violet emitting LED 602 is laterally offset from wavelength converter 410 of white emitting LED 404. Violet emitting LED 602 is mounted above substrate 402 next to white emitting LED 404. In some examples, dichroic combiner 604 may be a dichoric plate or mirror mounted at an angle (e.g., 45 degrees) to the horizontal emitting surface of white emitting LED 404 and the vertical emitting surface of violet emitting LED 602 to combine their light. In other examples, dichroic combiner 604 may be a dichroic cube with bottom and lateral surfaces facing the emitting surfaces of white emitting LED 404 violet emitting LEDs 702, respectively.

Package 600 may include reflective side coating 412 on lateral surfaces of white emitting LED 404 (i.e., on lateral surfaces of blue emitting LED die 408 and wavelength converter 410).

Figure 7:
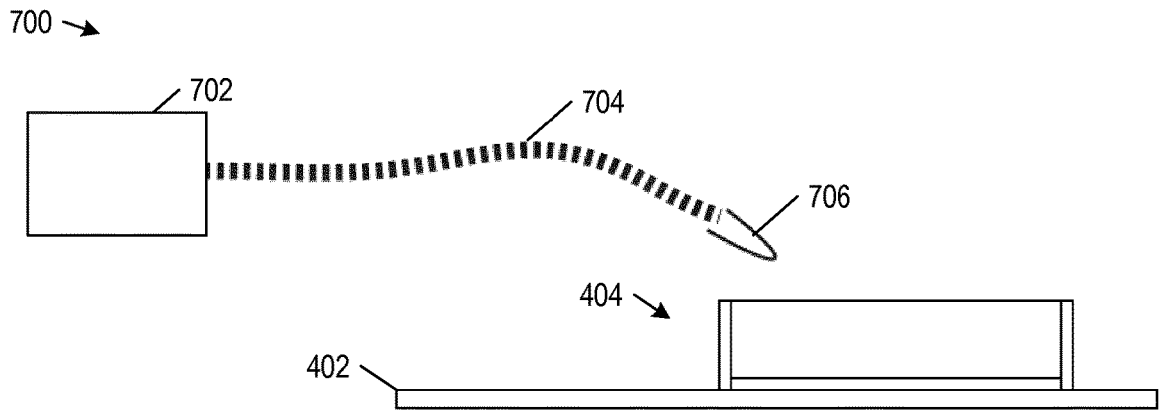

FIG. 7 illustrates a LED package 700 in examples of the present disclosure. Package 700 includes substrate 402, white emitting LED 404 above substrate 402, a violet emitting laser 702, a light guide 704, and a focus lens 706.

Violet emitting laser 702 is coupled to one end of light guide 704, and focus lens 706 is coupled to the other end of light guide 704. Violet emitting laser 702 emits violet light into light guide 704, which is directed by focus lens 706 onto wavelength converter 410 of white LED 404. Wavelength converter 410 scatters and emits the violet light with the white light.

Package 700 may include reflective side coating 412 on lateral surfaces of white emitting LED 404 (i.e., on lateral surfaces of blue emitting LED die 408 and wavelength converter 410).

Figure 8:
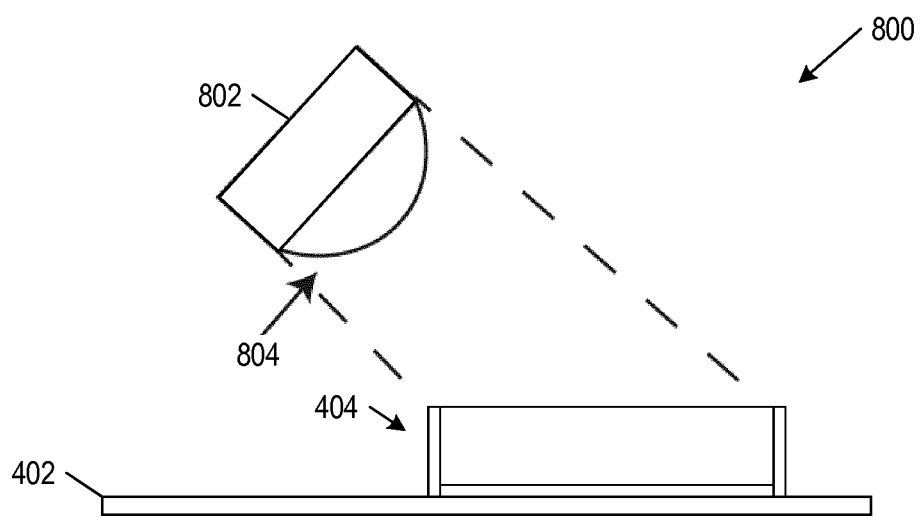

FIG. 8 illustrates a LED package 800 in examples of the present disclosure. Package 800 includes substrate 402, white emitting LED 404 above substrate 402, a violet emitting LED 802, and a focus lens 804.

Violet emitting LED 802 mounted above substrate 402 next to white emitting LED 404. Violet emitting LED 802 may be mounted at an angle so its emitting surface is directed toward the emitting surface of white LED 404. Focus lens 804 is mounted to the emitting surface of violet emitting LED 802. Violet emitting LED 802 emits violet light, which is directed by focus lens 804 onto wavelength converter 410 of white LED 404. Wavelength converter 410 scatters and emits the violet light with the white light.

Package 800 may include reflective side coating 412 on lateral surfaces of white emitting LED 404 (i.e., on lateral surfaces of blue emitting LED die 408 and wavelength converter 410).

Various other adaptations and combinations of features of the embodiments disclosed are within the scope of the invention. Numerous embodiments are encompassed by the following claims.

The invention claimed is:

1. A light-emitting package, comprising:
   a substrate;
   a white light-emitting structure above the substrate, the white light-emitting structure comprising a first light-emitting device and a wavelength converter layer on the first light-emitting device, the wavelength converter layer comprising a first surface facing the first light-emitting device and a second surface opposite the first surface; and
   a violet light-emitting device disposed on the second surface of the wavelength converter layer to overlie the first light-emitting device.

2. The light-emitting package of claim 1, wherein:
   the first light-emitting device of the white light-emitting structure is a blue light-emitting device die mounted on the substrate;

the wavelength converter layer is mounted on the blue light-emitting device die; and the violet light-emitting device is mounted on the wavelength converter layer.

3. The light-emitting package of claim 2, wherein the violet light-emitting device comprises a lateral die having electrical contacts on a top side of the die.

4. The light-emitting package of claim 3, wherein the wavelength converter layer comprises a ceramic phosphor.

5. The light-emitting package of claim 4, further comprising a reflective side coating on lateral surfaces of the blue light-emitting device and the wavelength converter layer.

6. The light-emitting package of claim 1, wherein the violet light-emitting device is disposed on an opposite surface of the wavelength converter layer compared to the first light-emitting device.

7. A method for a light-emitting package to generate light, comprising:

generating a white light with a white light-emitting structure, the white light-emitting structure including a first light-emitting device and a wavelength converter layer on the first light-emitting device, the wavelength converter layer comprising a first surface facing the light-emitting device and a second surface opposite the first surface;

generating a violet light with a violet light-emitting device, the violet light-emitting device disposed on the second surface of the wavelength converter layer to overlie the first light-emitting device; and directing light from the violet light-emitting device onto the wavelength converter layer.

8. The method of claim 7, wherein:

the first light-emitting device of the white light-emitting structure is a blue light-emitting device die mounted on the substrate;

the wavelength converter is mounted on the blue light-emitting device die; and the violet light-emitting device is mounted on the wavelength converter.

9. The method of claim 8, wherein the violet light-emitting device is transparent to light emitted by the white light-emitting structure.

10. The method of claim 9, wherein the violet light-emitting device comprises a lateral die having electrical contacts on a top side of the die.

11. The method of claim 10, wherein the wavelength converter layer comprises a ceramic phosphor.

12. The method of claim 11, further comprising reflecting light on lateral surfaces of the blue light-emitting device and the wavelength converter layer with a reflective side coating.

* * * * *